United States Patent
Aronson et al.

(10) Patent No.: US 7,526,207 B2
(45) Date of Patent: Apr. 28, 2009

(54) FLEXIBLE CIRCUIT DESIGN FOR IMPROVED LASER BIAS CONNECTIONS TO OPTICAL SUBASSEMBLIES

(75) Inventors: Lewis B. Aronson, Los Altos, CA (US); Girogio Giarreta, Mountain View, CA (US); The-Linh Nguyen, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 537 days.

(21) Appl. No.: 10/687,107

(22) Filed: Oct. 16, 2003

(65) Prior Publication Data

US 2004/0202214 A1    Oct. 14, 2004

Related U.S. Application Data

(60) Provisional application No. 60/419,437, filed on Oct. 18, 2002.

(51) Int. Cl.
H04B 10/00 (2006.01)
(52) U.S. Cl. .................. 398/164; 398/183; 398/207
(58) Field of Classification Search .................. 398/164, 398/182–183, 207
See application file for complete search history.

(56) References Cited

U.S. PATENT DOCUMENTS

| | | | |
|---|---|---|---|
| 3,271,214 A | 9/1966 | Tabor | |
| 3,629,787 A | 12/1971 | Wilson | |
| 3,987,676 A | 10/1976 | Bennewitz | |
| 4,011,980 A | 3/1977 | Dvorak et al. | |
| 4,092,061 A | 5/1978 | Stigliani, Jr. | |
| 4,128,697 A | 12/1978 | Simpson | |
| 4,162,817 A | 7/1979 | Briggs et al. | |
| 4,179,802 A | 12/1979 | Joshi et al. | |
| 4,295,696 A | 10/1981 | Gray | |
| 4,375,578 A | 3/1983 | Mitchell et al. | |
| 4,435,031 A | 3/1984 | Black et al. | |
| 4,435,740 A | 3/1984 | Huckabee et al. | |
| 4,769,684 A | 9/1988 | Crocker et al. | |
| 4,815,990 A | 3/1989 | Ristedt et al. | |
| 4,818,099 A | 4/1989 | Preikschat et al. | |

(Continued)

FOREIGN PATENT DOCUMENTS

CN    2032364    2/1989

(Continued)

OTHER PUBLICATIONS

U.S. Appl. No. 10/077,067, filed Feb. 14, 2002, Rosenberg.

(Continued)

*Primary Examiner*—Dzung D Tran
(74) *Attorney, Agent, or Firm*—Workman Nydegger

(57) ABSTRACT

A flexible circuit used in connecting driver circuitry with an optical assembly of a transceiver. The flexible circuit includes one or more first transmission lines that enable modulated signals to be delivered from the driver circuitry to the optical assembly. Electrically connected to the one or more first transmission lines are one or more second transmission lines that connect a bias current source to the optical assembly. By connecting the second transmission lines to the first transmission lines at a distal end of the first transmission lines, the flexible circuit assists in reducing the voltage needed to operate the optical assembly of the transceiver and reduces the bias voltage used to bias the modulated signals.

12 Claims, 4 Drawing Sheets

U.S. PATENT DOCUMENTS

| | | | |
|---|---|---|---|
| 4,952,016 A | 8/1990 | Adams et al. |
| 4,953,006 A | 8/1990 | Kovats et al. |
| 4,962,991 A | 10/1990 | Carvalho |
| 4,973,211 A | 11/1990 | Potucek |
| 5,044,980 A | 9/1991 | Krumme et al. |
| 5,125,054 A | 6/1992 | Ackley et al. |
| 5,136,682 A | 8/1992 | Moyer et al. |
| 5,159,535 A | 10/1992 | Desai et al. |
| 5,212,345 A | 5/1993 | Gutierrez |
| 5,249,245 A | 9/1993 | Lebby et al. |
| 5,253,311 A | 10/1993 | Killen et al. |
| 5,262,590 A | 11/1993 | Lia |
| 5,299,276 A | 3/1994 | Okamura et al. |
| 5,343,360 A | 8/1994 | Sanwo |
| 5,359,686 A | 10/1994 | Galloway et al. |
| 5,361,317 A | 11/1994 | Hartman et al. |
| 5,371,820 A | 12/1994 | Welbourn et al. |
| 5,371,822 A | 12/1994 | Horwitz et al. |
| 5,375,184 A | 12/1994 | Sullivan |
| 5,389,686 A | 2/1995 | Diop et al. |
| 5,409,384 A | 4/1995 | Green et al. |
| 5,414,786 A | 5/1995 | Ohta et al. |
| 5,420,954 A | 5/1995 | Swirhun et al. |
| 5,428,190 A | 6/1995 | Stopperan |
| 5,432,630 A | 7/1995 | Lebby et al. |
| 5,452,182 A | 9/1995 | Eichelberger et al. |
| 5,462,441 A | 10/1995 | Renn et al. |
| 5,471,552 A | 11/1995 | Wuu et al. |
| 5,474,463 A | 12/1995 | Robinson et al. |
| 5,479,288 A * | 12/1995 | Ishizuka et al. ............. 398/164 |
| 5,495,125 A | 2/1996 | Uemura |
| 5,499,312 A | 3/1996 | Hahn et al. |
| 5,539,848 A | 7/1996 | Galloway |
| 5,545,846 A | 8/1996 | Williams et al. |
| 5,596,662 A | 1/1997 | Boscher |
| 5,613,024 A | 3/1997 | Shahid |
| 5,625,734 A | 4/1997 | Thomas et al. |
| 5,638,469 A | 6/1997 | Feldman et al. |
| 5,666,449 A | 9/1997 | Sawae et al. |
| 5,703,895 A | 12/1997 | Ghirardi et al. |
| 5,706,378 A | 1/1998 | Suzuki et al. |
| 5,717,800 A | 2/1998 | Funabashi |
| 5,733,151 A | 3/1998 | Edsall et al. |
| 5,752,851 A | 5/1998 | Zaderej et al. |
| 5,774,614 A | 6/1998 | Gilliland et al. |
| 5,788,143 A | 8/1998 | Boyd et al. |
| 5,844,783 A | 12/1998 | Kojima |
| 5,894,409 A | 4/1999 | Tanaka |
| 5,974,214 A | 10/1999 | Shacklette et al. |
| 5,996,222 A | 12/1999 | Shangguan et al. |
| 6,010,359 A | 1/2000 | Etters et al. |
| 6,011,695 A | 1/2000 | Dumke |
| 6,017,222 A | 1/2000 | Kao |
| 6,039,600 A | 3/2000 | Etters et al. |
| 6,040,624 A | 3/2000 | Chambers et al. |
| 6,043,990 A | 3/2000 | Johnson et al. |
| 6,045,269 A | 4/2000 | Watanabe et al. |
| 6,069,991 A | 5/2000 | Hibbs-Brenner et al. |
| 6,088,498 A | 7/2000 | Hibbs-Brenner et al. |
| 6,091,475 A | 7/2000 | Ogino et al. |
| 6,118,072 A | 9/2000 | Scott |
| 6,118,666 A | 9/2000 | Aoki et al. |
| 6,162,065 A | 12/2000 | Benham |
| 6,181,011 B1 | 1/2001 | Rostoker et al. |
| 6,195,261 B1 | 2/2001 | Babutzka et al. |
| 6,268,231 B1 | 7/2001 | Wetzel |
| 6,294,255 B1 | 9/2001 | Suzuki et al. |
| 6,300,164 B1 | 10/2001 | Call et al. |
| 6,305,848 B1 | 10/2001 | Gregory |
| 6,326,553 B1 | 12/2001 | Yim et al. |
| 6,350,063 B1 | 2/2002 | Gilliland et al. |
| 6,380,493 B1 | 4/2002 | Morita et al. |
| 6,404,960 B1 | 6/2002 | Hibbs-Brenner et al. |
| 6,439,918 B1 | 8/2002 | Togami et al. |
| 6,473,314 B1 | 10/2002 | Custer et al. |
| 6,483,712 B1 | 11/2002 | Oliphant et al. |
| 6,485,322 B1 | 11/2002 | Branch et al. |
| 6,521,989 B2 | 2/2003 | Zhou |
| 6,537,082 B2 | 3/2003 | Hopfer, III et al. |
| 6,580,739 B1 | 6/2003 | Coldren |
| 6,586,678 B1 | 7/2003 | Rosenberg et al. |
| 6,617,518 B2 | 9/2003 | Ames et al. |
| 6,624,000 B1 | 9/2003 | Coldren |
| 6,700,079 B2 | 3/2004 | Bogursky et al. |
| 6,703,561 B1 | 3/2004 | Rosenberg et al. |
| 6,709,607 B2 | 3/2004 | Hibbs-Brenner et al. |
| 6,734,658 B1 | 5/2004 | Bierer |
| 6,767,220 B2 | 7/2004 | Wilson et al. |
| 6,769,920 B1 | 8/2004 | Mease et al. |
| 6,781,727 B2 * | 8/2004 | Auracher et al. ............. 398/163 |
| 6,800,169 B2 | 10/2004 | Liu et al. |
| 6,809,905 B2 | 10/2004 | Kilmer |
| 6,812,803 B2 | 11/2004 | Goergen |
| 6,841,733 B2 | 1/2005 | Schiaffino et al. |
| 6,852,928 B2 | 2/2005 | Giaretta et al. |
| 6,860,649 B2 | 3/2005 | Edwards et al. |
| 6,863,453 B2 * | 3/2005 | Wang et al. ................... 385/94 |
| 6,867,368 B2 | 3/2005 | Kumar |
| 6,867,377 B2 | 3/2005 | Anderson et al. |
| 6,878,875 B2 | 4/2005 | Aronson et al. |
| 6,911,599 B2 | 6/2005 | Rosenberg et al. |
| 6,947,672 B2 * | 9/2005 | Jiang et al. .................. 398/135 |
| 6,996,304 B2 | 2/2006 | Aronson et al. |
| 7,010,233 B2 * | 3/2006 | Lindblad .................... 398/164 |
| 7,066,659 B2 | 6/2006 | Aronson et al. |
| 7,275,937 B2 | 10/2007 | Ellison |
| 7,311,240 B2 | 12/2007 | Nippa et al. |
| 2001/0017376 A1 | 8/2001 | Verdiell |
| 2002/0136501 A1 | 9/2002 | Yen et al. |
| 2002/0170742 A1 | 11/2002 | Liaw et al. |
| 2002/0181895 A1 | 12/2002 | Gilliland et al. |
| 2003/0102157 A1 | 6/2003 | Rosenberg et al. |
| 2003/0197254 A1 | 10/2003 | Huang |
| 2004/0018409 A1 | 1/2004 | Hui et al. |
| 2004/0062491 A1 | 4/2004 | Sato et al. |
| 2004/0090620 A1 | 5/2004 | Farr |
| 2004/0092135 A1 | 5/2004 | Hofmeister et al. |
| 2004/0151505 A1 | 8/2004 | Aronson et al. |
| 2004/0202214 A1 | 10/2004 | Aronson et al. |
| 2005/0018409 A1 | 1/2005 | Hirakata |
| 2005/0045374 A1 | 3/2005 | Kumar |
| 2005/0130488 A1 | 6/2005 | Zhu et al. |
| 2005/0242160 A1 | 11/2005 | Nippa et al. |
| 2005/0244095 A1 | 11/2005 | Ellison |
| 2005/0245103 A1 | 11/2005 | Ellison |
| 2005/0245118 A1 | 11/2005 | Liu et al. |
| 2005/0265650 A1 | 12/2005 | Priyadarshi et al. |
| 2006/0032665 A1 | 2/2006 | Ice |
| 2006/0062526 A1 | 3/2006 | Ikeuchi |

FOREIGN PATENT DOCUMENTS

| | | |
|---|---|---|
| CN | 03808386.8 | 9/2007 |
| GB | 0 881 671 | 12/1998 |
| GB | 0 905 838 | 3/1999 |
| JP | 61-071689 | 4/1986 |
| JP | 62-114545 | 5/1987 |
| JP | 63-136680 | 6/1988 |
| JP | 01-169986 | 5/1989 |
| JP | 02-240989 | 9/1990 |
| JP | 03-0148190 | 6/1991 |
| JP | 406034838 | 2/1994 |
| JP | 407159636 | 6/1995 |
| JP | 09-223848 | 8/1997 |

| | | |
|---|---|---|
| JP | 2000228006 | 8/2000 |
| JP | 2003568752 | 5/2007 |
| WO | 92/00538 | 1/1992 |

OTHER PUBLICATIONS

U.S. Appl. No. 10/231,395, filed Aug. 29, 2002, Rosenberg.
U.S. Appl. No. 10/629,253, filed Jul. 28, 2003, Aronson.
U.S. Appl. No. 10/629,724, filed Jul. 28, 2003, Giaretta.
U.S. Appl. No. 10/748,051, filed Dec. 30, 2003, Aronson.
U.S. Appl. No. 10/795,597, filed Mar. 8, 2004, Rosenberg.
U.S. Appl. No. 11/029,067, filed Jan. 3, 2005, Aronson.
U.S. Appl. No. 10/629,253, Office Action, mailed Feb. 24, 2005.
U.S. Appl. No. 10/629,253, Office Action, mailed Oct. 4, 2005.
U.S. Appl. No. 10/629,724, Notice of Allowance, mailed Sep. 22, 2004.
U.S. Appl. No. 10/409,837, Office Action, mailed Jun. 15, 2005.
U.S. Appl. No. 10/409,837, Office Action, mailed Oct. 31, 2005.
U.S. Appl. No. 10/409,837, Office Action, mailed May 26, 2006.
U.S. Appl. No. 10/409,837, Office Action, mailed Nov. 14, 2006.
U.S. Appl. No. 10/409,837, Office Action, mailed May 17, 2007.
U.S. Appl. No. 10/409,837, Office Action, mailed Dec. 7, 2007.
U.S. Appl. No. 10/836,728, Office Action, mailed Jul. 19, 2005.
U.S. Appl. No. 10/836,728, Office Action, mailed Jan. 18, 2006.
U.S. Appl. No. 10/836,728, Office Action, mailed May 5, 2006.
U.S. Appl. No. 10/836,728, Office Action, mailed Jan. 16, 2007.
U.S. Appl. No. 10/836,728, Notice of Allowance, mailed May 30, 2007.
U.S. Appl. No. 10/836,728, Notice of Allowance, mailed Jul. 25, 2007.
XFP MSA Group; http://www.org/cgi-bin/home.cgi.
U.S. Appl. No. 10/748,051, Office Action, mailed May 27, 2004.
U.S. Appl. No. 10/795,597, Notice of Allowance, mailed Aug. 25, 2004.
U.S. Appl. No. 10/795,597, Notice of Allowance, mailed Jan. 26, 2005.
U.S. Appl. No. 10/835,832, Office Action, mailed Oct. 19, 2005.
U.S. Appl. No. 10/835,832, Office Action, mailed Jun. 7, 2006.
U.S. Appl. No. 10/835,832, Office Action, mailed Dec. 15, 2006.
U.S. Appl. No. 10/835,932, Office Action, mailed Aug. 9, 2007.
U.S. Appl. No. 10/835,832, Office Action, mailed Dec. 28, 2007.
U.S. Appl. No. 10/836,129, Office Action, mailed Mar. 13, 2006.
U.S. Appl. No. 10/836,129, Notice of Allowance, mailed Aug. 10, 2007.
U.S. Appl. No. 11/029,067, Notice of Allowance, mailed Jun. 29, 2005.
U.S. Appl. No. 11/094,990, Office Action, mailed Mar. 28, 2006.
U.S. Appl. No. 11/094,990, Office Action, mailed Oct. 12, 2006.
U.S. Appl. No. 11/094,990, Office Action, mailed, Apr. 5, 2007.
U.S. Appl. No. 11/094,990, Office Action, mailed Dec. 6, 2007.
U.S. Appl. No. 11/179,223, Office Action, mailed Feb. 23, 2007.
U.S. Appl. No. 11/179,223, Office Action, mailed Nov. 19, 2007.
U.S. Appl. No. 11/179,223, Non-Final Rejection, mailed May 29, 2008.
U.S. Appl. No. 10/409,837, filed Apr. 9, 2003, Kumar, et al.
U.S. Appl. No. 10/835,832, filed Apr. 30, 2004, Kumar, et al.
U.S. Appl. No. 10/836,728, filed Apr. 30, 2004, Ellison.
U.S. Appl. No. 11/094,990, filed Mar. 31, 2005, Liu, et al.
U.S. Appl. No. 11/179,223, filed Jul. 11, 2005, Ice, Donald A.
U.S. Appl. No. 10/836,129, filed Apr. 30, 2004, Nippa, et al.
Murata, S., Nishimura, K., *Improvement in Thermal Properties of a Multi-Beam Laser Diode Array*, Japanese Journal of Applied Physics, vol. 28, Suppl. 28-3, pp. 165-170 (1989).
Ali, "New Materials and Design Components for Integrated Optics," Technology Report/Fiberoptics, Laser Focus World, vol. 21, No. 8, Aug. 1985, Tulsa, U.S., pp. 48-50.
Cohen, "Passive Laser-Fiber Alignment by Index Method," IEEE Photonics Technology Letters, vol. 3, No. 11, Dec. 1991, pp. 985-987, New York, U.S.
Coldren, et al., "Flip-Chip Bonded, Back-Emitting, Microlensed Arrays of Monolithic Vertical Cavity Lasers and Resonant Photodetectors," Electronic Components and Technology Conference, Sep. 1999, pp. 733-740.
Havant, "Flexible Interposing Carrier Scheme for Optical Waveguides," Research Disclosure No. 303, Jul. 1989, p. 512.
Hibbs-Brenner, et al., "Packaging of VCSEL Arrays for Cost-Effective Interconnects at <10 Meters," Electronic Components and Technology Conference, Sep. 1999, pp. 747-752.
Hsu, et al., "Flip-chip Approach to Endfire Coupling Between Single-Mode Optical Fibres and Channel Waveguides," Patent Associates Literature, Electronic Letters, vol. 12, No. 16, pp. 404-405, Aug. 5, 1976.
Kazlas, et al., "Monolithic Vertical-Cavity Laser/p-i-n Photodiode Transceiver Array for Optical Interconnects," IEEE Photonics Technology Letters, Nov. 1998, pp. 1530-1532, vol. 10, No. 11.
Louderback, et al., "Flip Chip Bonded Arrays of Monolithically Integrated, Microlensed Vertical-Cavity Lasers and Resonant Photodetectors," IEEE Photonics Technology Letters, Mar. 1999, pp. 304-306, vol. II, No. 3.
Plawsky, et al., "Photochemically Machined, Glass Ceramic, Optical Fiber Interconnection Components," Article, Optoelectronic Materials, Devices, Packaging and Interconnects (1998), SPIE, vol. 994, pp. 101-106.
Sullivan, et al., "Polymeric Waveguides," 1992 IEEE, pp. 27-31.

* cited by examiner ns to Optical Subassemblies," the disclosure of which is incorporated herein by this reference.

BACKGROUND OF THE INVENTION

1. The Field of the Invention

The present invention generally relates to electrical circuits, and more specifically, relates to electrical circuits for improving bias connections within electrical circuits adapted to accommodate alternating current and direct current signals.

2. The Relevant Technology

Fiber optics are increasingly used for transmitting voice and data signals, such as telecommunication signals, broadcast programming signals, multimedia signals, or the like. As a transmission medium, light provides a number of advantages over traditional electrical communication techniques. For example, light signals allow for extremely high transmission rates and very high bandwidth capabilities. Additionally, light signals are resistant to electromagnetic interference that would otherwise interfere with electrical signals. Light also provides a more secure signal because it does not emanate the type of high frequency components often experienced with conductor-based electrical signals. Light also can be conducted over greater distances without the signal loss typically associated with electrical signals on copper conductors.

The light signals are conducted using the principles of refraction and reflection to effectively trap the light signal within an interior of optical fibers. Because the light signals are trapped within a particular fiber, many fibers can be included in a single cable without concern about interference from the light signals carried by nearby fibers. Optical fibers also have the property of strongly rejecting interference that would otherwise be caused by radio frequencies and electromagnetic radiation. These characteristics make optical fibers ideally suited for many applications.

While optical communications provide a number of advantages, the use of light as a transmission medium presents a number of implementation challenges. In particular, the data carried by a light signal must be converted to an electrical format when received by a device, such as a network switch. Conversely, when data is transmitted to the optical network, it must be converted from an electronic signal to a light signal. A number of protocols define the conversion of electrical signals to optical signals and transmission of those optical signals. For instance, one protocol is implemented using a transceiver module at both ends of a fiber optic cable. Each transceiver module typically contains laser transmitter circuitry capable of converting electrical signals to optical signals, and an optical receiver capable of converting received optical signals back into electrical signals. The laser transmitter circuitry includes a laser driver that causes a laser diode of the transceiver to generate the optical signal representation of the electrical signals. Often, a flexible circuit connects the printed circuit board (PCB) containing the laser driver to the laser diode, or more generally an optical assembly containing the laser diode.

To operate correctly, the laser diode of the transceiver is supplied with both a controlled direct current (DC) bias current and an alternating current (AC) modulation current; the DC bias current allowing the laser diode to properly respond to the AC modulation. Various manners are known to combine AC and DC signals, however, optical networks have specific size, speed, and voltage requirements that limit the applicability of typical techniques. For instance, typical Bias T circuits used to combine AC and DC signals are impractical for use in small form-factor pluggable transceivers, such as those used in optical communication systems. Traditional Bias T circuits use large inductors that are impractical for use in a transceiver because of the size of the components involved. In addition, when a Bias T circuit is used, impedance matching issues associated with signal reflection at the laser diode arise because the inductor is located remotely from the laser diode.

Alternative transceiver circuits utilize resistive dividers to control the AC and DC signals delivered to the laser diode. Unfortunately, resistive dividers lead to a tradeoff between inefficient delivery of AC modulation signals to the laser diode and the use of large resistors in the DC bias chain, which in turn requires large supply voltages and results in a transceiver with high power consumption.

Effects of the above are heightened when the transceiver modulates optical signals at a high rate. In high speed transceiver designs, 10 Gigabits/s, or the like, microwave design considerations often require the placing of matching resistors or impedances very close to the laser diode. In many cases, the flexible circuit connecting the PCB containing the laser driver and the optically assembly includes impedance-controlled lines for the high-speed signals. To perform series matching, the matching resistors or impedances are placed on the flexible circuit at the end near the laser diode and the combined AC modulation signal and DC bias circuit flows through this resistor or impedance and the laser diode, as illustrated in FIG. 1.

As shown, the circuitry 10 includes a laser driver 12 that supplies high-speed electrical modulation needed for a laser diode 16. To allow proper operation of the laser diode, circuitry 10 includes DC bias circuit 14. Impedance matching resistors 18a and 18b are located at the end of lines 20a and 20b near laser diode 16 to prevent loss and signal distortion associated with signal reflection. In this configuration, in the series resistance the bias chain of bias circuit 14 must be made large enough that the portion of the AC modulation signals being lost in DC bias circuit 14 is relatively small. Since the resulting resistors in the bias chain, resistors 22, 18a, 18b, and 24, are relatively large, the voltage drop through this network can be relatively large.

As a consequence of the above, many existing circuits require voltages in excess of 5V typically provided by an external voltage source. Obtaining these increased voltages is difficult for transceivers with 5V external supplies, the typical supply voltage provided to small form-factor pluggable transceivers. Furthermore, the impedance matching to bias circuit 14 is often poor and leads to reflections that degrade the optical output signal generated by laser diode 16.

It would be an advance, therefore, to provide systems and devices that allow for the combining of AC and DC signals, while eliminating the need for internally increasing the supply voltage to accommodate for voltage losses in the transceiver circuitry and maintaining the quality of the AC modulation signals delivered to an optical assembly that generates the light signals propagated along optical fibers.

BRIEF SUMMARY OF THE INVENTION

These and other problems in the prior art are addressed by embodiments of the present invention, which relates to electrical circuits for improving bias connections within electrical circuits adapted to accommodate alternating current and direct current signals. In an illustrated embodiment, the electrical circuit reduces the bias voltage needed to bias the AC modulated signals created by driver circuitry associated with a transceiver module.

In one embodiment, the present invention is associated with a transceiver module used to transmit and receive optical or light signals. The transceiver module includes various electronics that create modulated signals representative of data to be transmitted using an optical fiber. Additional components and circuits of the transceiver convert the modulated signals into optical or light signals that are propagated along an optical fiber. The circuitry of the transceiver module delivers the modulated signals to an optical assembly of the transceiver, while reducing the voltage needed to operate the optical assembly of the transceiver. More specifically, the circuitry configuration reduces the bias voltage used to bias a portion of the circuitry, thereby reducing the transceiver's overall power consumption, eliminating the requirement to internally increase an externally supplied voltage to accommodate for voltage losses within the transceiver circuitry, and increasing the quality of the signals output by the optical assembly.

The above can be achieved, in one embodiment, by providing a flexible circuit that connects the driver circuitry and the optical assembly. In addition, the flexible circuit connects a voltage source and associated bias circuit to the optical assembly to enable biasing of the modulated signals generated by the driver circuit. By connecting the driver circuit and the voltage source to the optical assembly in a particular configuration, the flexible circuit aids in reducing the bias voltage needed to bias the modulated signals.

In one illustrative configuration, the flexible circuit includes one or more first transmission lines, each being adapted to deliver modulated signals from the driver circuitry to the optical assembly. These first transmission lines can optionally include one or more matching impedances that minimize the potential for reflection of the modulated signals. Connected to the first transmission lines are one or more second transmission lines that carry the bias voltage from the voltage source. By connecting these second transmission lines at a point on the first transmission lines that is in close proximity to the optical assembly, a smaller bias voltage is needed than is typically used in the prior art. For instance, when each first conductor or transmission line includes a matching impedance, the second transmission lines are connected at a point on each of the first conductor or transmission lines between the matching impedance and the optical assembly. Consequently, the bias voltage needed is reduced because the impedance associated with the second conductor or transmission line is not in series with the matching impendence, as is typically the case in prior art transceiver circuitry.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Reference will now be made to the drawings to describe exemplary embodiments of the invention. It is to be understood that the drawings are diagrammatic and schematic representations of the exemplary embodiments, and are not limiting of the present invention.

In general, the present invention relates to systems and devices that deliver modulated signals to an optical assembly of a transceiver, while reducing the voltage needed to operate the optical assembly of the transceiver. More specifically, embodiments of the present invention reduce the bias voltage used to bias a portion of the transceiver circuitry, thereby reducing the transceiver's overall power consumption. The transceiver's power dissipation is reduced through lowering the supply voltage and lowering the power level of the alternating current (AC) modulation signals generated by driver circuitry of the transceiver.

By lowering the bias voltages used in the transceiver circuitry, embodiments of the present invention also eliminate the requirement to internally increase an externally supplied voltage to accommodate for voltage losses within the transceiver circuitry. Consequently, the present invention eliminates the need for an internal voltage doubler or the like to increase the input voltage to an appropriate level that accommodates for voltage losses.

Furthermore, the present invention increases the quality of the signals output by the optical assembly. This is achieved by reducing signal reflections within the transceiver circuitry through decreasing impedance values needed to perform impedance matching. Consequently, embodiments of the present invention enable the creation of compact, high-speed transceivers.

Figure 2:
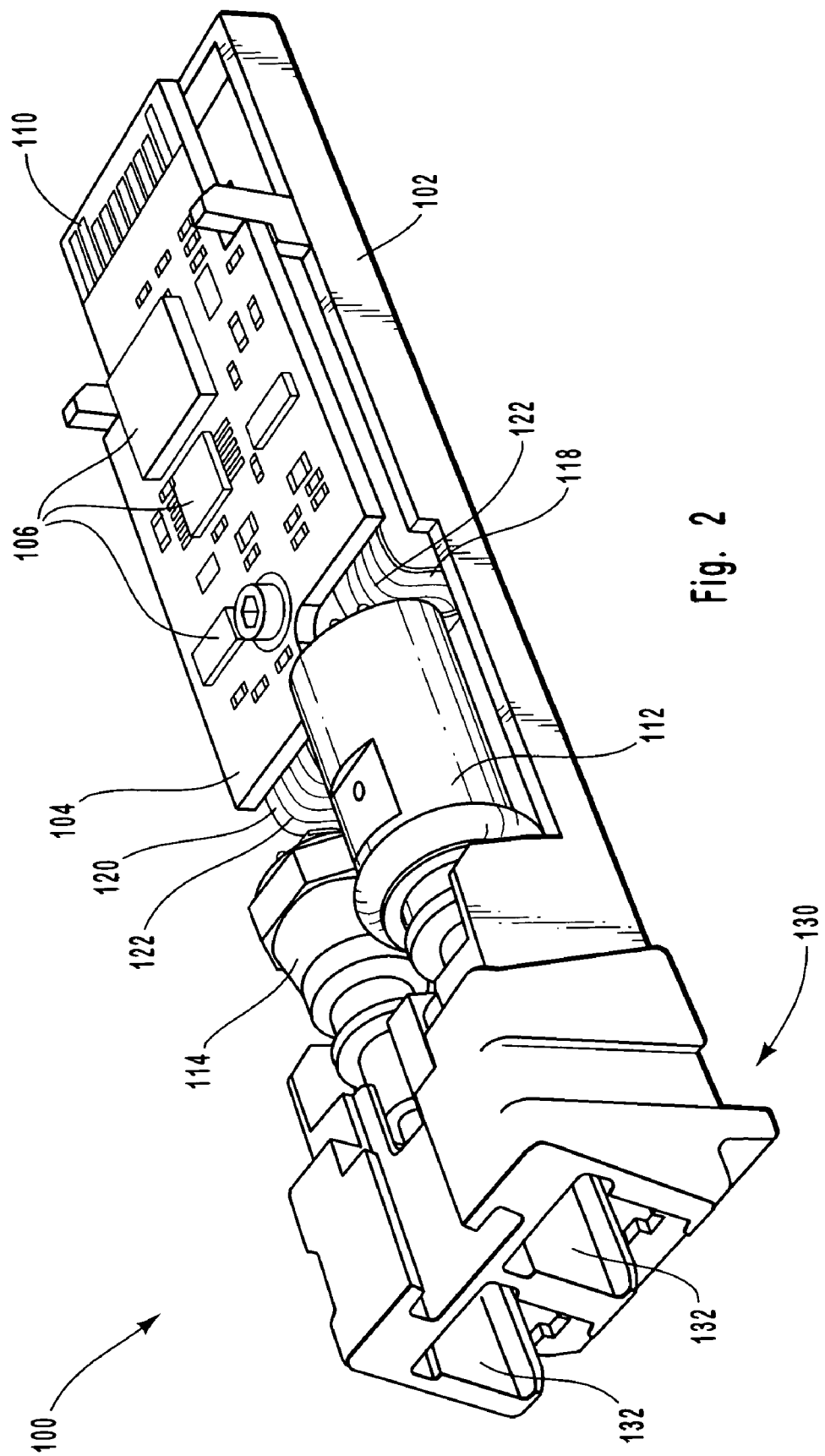
FIG. 2 illustrates one embodiment of a transceiver configured in accordance with one aspect of the present invention.

Reference is first made to FIG. 2, which illustrate a perspective view of one presently preferred embodiment of an optical transceiver module, designated generally at 100. As the name suggests, transceiver module 100 both transmits signals and receives signals. Consequently, and as will be described in greater detail hereinafter, transceiver module 100 delivers optical signals to an optical fiber (not shown) and receives optical signals from an optical fiber (not shown). The term "transceiver" refers to a device that can both transmit one or more signals and receive one or more signals. The invention is also applicable to optical transmitters that are not integrated with an optical receiver.

In the illustrated example of FIG. 2, module 100 has a base portion 102 that is configured to support and retain a printed circuit board 104. In this example, the circuit board 104 accommodates transceiver electronics 106, including transmitting electronics, receiving electronics, such as a laser driver, optical electronics, or the like. Although reference is made to specific circuitry and components of module 100, it is understood by one skilled in the art in light of the teaching contained herein that printed circuit board 104 can include any circuitry or components depending on the type of optical module being used.

Also formed on the printed circuit board 104 is an exposed edge connector 110. The edge connector 110 is configured to be electrically compatible with a corresponding electrical connector (not shown) that is positioned within the port of a host device, such as a computer device or other hardware device. Other connector schemes that are well known in the art in light of the teaching contained herein could also be used.

In the illustrated embodiment, disposed near printed circuit board 104, at the end opposite to edge connector 110, are two flexible circuits 118 and 120 that connect printed circuit board 104 to an optical transmitter 112 and an optical receiver 114 respectively. The flexible circuits 116 and 118 include one or more conductors 122 sandwiched between a first insulating layer and a second insulating layer; each insulating layer acting as a dielectric to prevent the extraneous transmission or conduction of signals. The conductors provide a path for signals, current, and voltage to flow between optical transmitter 116, optical receiver 118, and printed circuit board 104.

In addition to functioning to provide a path for signal currents, each of the one or more conductors 122 can include one or more impedances, such as matching impedances, to aid with reducing the effects of signal reflection. As signals from printed circuit board 104 are delivered to optical transmitter 112, in one embodiment, reflection losses can occur due to discontinuities in conductors 122 or transmission lines between printed circuit board 104 and optical transmitter 112. These losses result in degradation in the quality of the signals received by optical transmitter 112 and a resultant degradation in the quality of the signal propagated along the attached optical fiber (not shown). Including matching impedances within flexible circuit 116 and 118 can minimize these reflection losses.

The optical transmitter 112, connected to flexible circuit 116, is part of an optical assembly that generates optical or light signals representative of the signals received from printed circuit board 104. Illustratively, optical transmitter 112 can be laser diode, a light emitting diode, or the like. For example, printed circuit board 104 can generate alternating current (AC) modulated signals that are deliverable to optical transmitter 112, which in turn generates optical or light signals that can be propagated along a connected optical fiber (not shown). Similarly, optical receiver 114 forms part of an optical assembly that receives optical or light signals from an optical fiber (not shown) and generates electrical signals representative of the receives signals. Illustratively, optical receiver 114 can be PIN or avalanche photodiode combined with a transimpedance amplifier.

The optical fibers (not shown) connect to module 100 through a connector portion 130 positioned at one end of base portion 102. The connector portion 130 defines a receptacle configuration 132 that operatively receives a corresponding modular fiber connector configuration, such as is typically used to interface with an optical fiber cable. It will be appreciated by one skilled in the art in light of the teaching contained herein that the receptacle could be implemented to accommodate any one of a number of different connector configurations, depending on the particular application involved.

Figure 3:
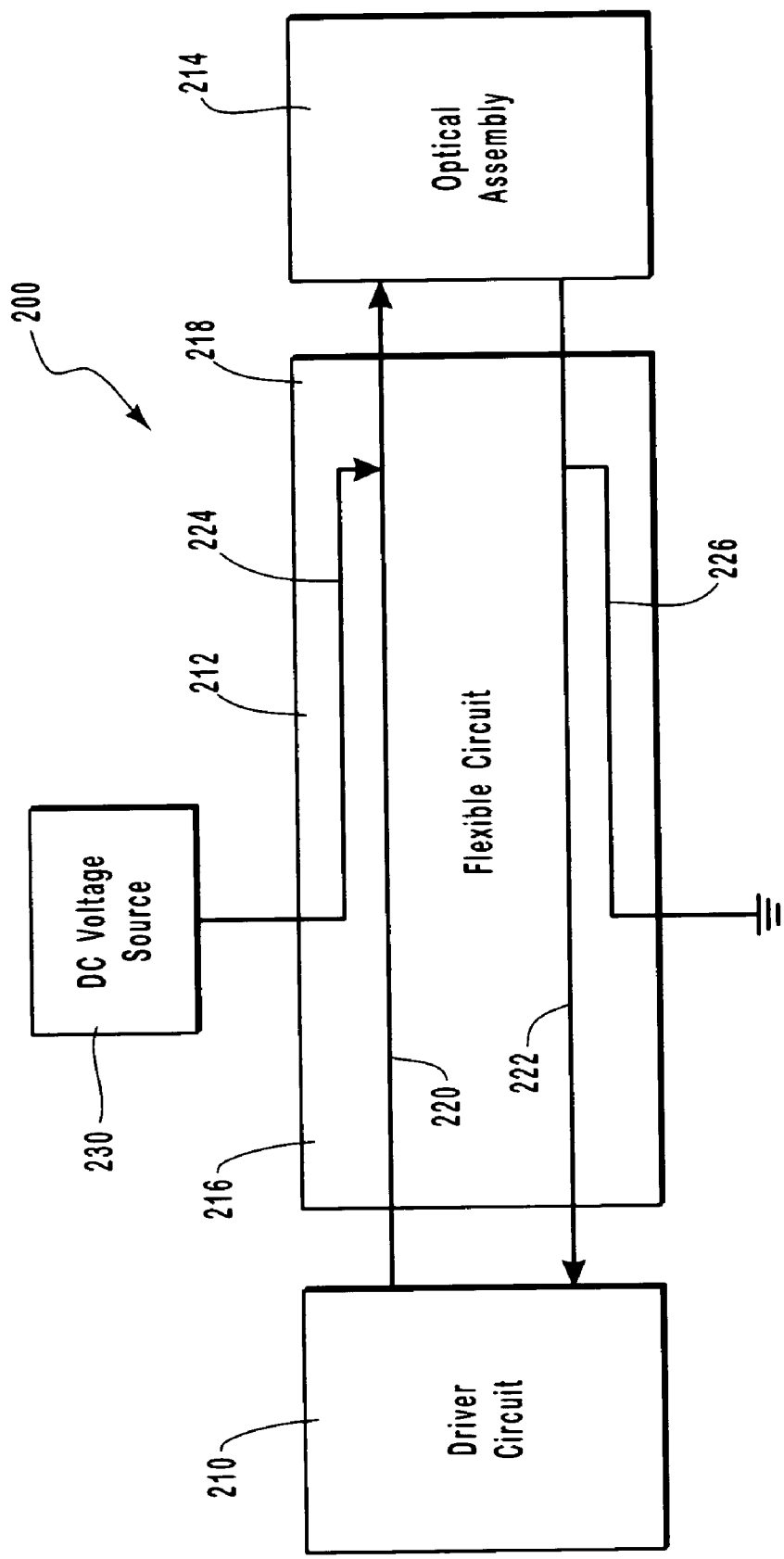
FIG. 3 illustrates a schematic block diagram of a portion of the transceiver configured in accordance with one aspect of the present invention depicted in FIG. 2.

Referring now to FIG. 3, illustrated is a schematic representation of a portion of a transceiver module 200, which can be the same as module 100. This particular portion of transceiver module 200 is configured to generate, deliver, and/or convert electrical signals to optical or light signals capable of being propagated along an optical fiber.

Illustratively, transceiver module 200 includes a flexible circuit 212, similar to flexible circuits 116 and 118 of FIG. 2, connecting a driver circuit or circuitry 210 to an optical assembly 214. As mentioned above, flexible circuit 212 provides several functions. Firstly, flexible circuit 212 provides a mechanism for delivering AC modulated signals to optical assembly 214 in a manner that simplifies the fabrication process of transceiver module 200. Further, as will be described in more detail hereinafter, flexible circuit 212 provides a mechanism through which AC modulation signals are delivered to optical assembly 214, while operating voltage needs of transceiver module 200 are reduced. Moreover, flexible circuit 212 provides a mechanism to reduce the bias voltage of transceiver module 200, thereby reducing the overall power consumption of transceiver module 200.

As illustrated, flexible circuit 212 has a proximal end 216 connected to driver circuit 210 and a distal end 218 connected to optical assembly 214. The flexible circuit 212 includes two transmission lines 220 and 222 that connect driver circuitry 210 to optical assembly 214. These transmission lines 220 and 222 enable AC modulated signals created by driver circuitry 210, based upon inputs received through edge connector 110 (FIG. 2), to be delivered to optical assembly 214. The optical assembly 214 converts the AC modulated signals into corresponding optical or light signals that are propagated along one or more optical fibers (not shown) connected to transceiver module 200.

The driver circuitry 210 is one example of structures capable of performing the function of means for generating one or more modulated signals. Various types of driver circuitry and means for generating are known to those skilled in the art in light of the teaching contained herein. For instance, and not by way of limitation, driver circuitry and means for generating can be an analog driver or a digital driver. Further, the particular driver circuitry and means for generating can vary based upon the particular wavelength of light, the modulation speed required of the transceiver module, the costs of the transceiver module, or the like.

Figure 4:
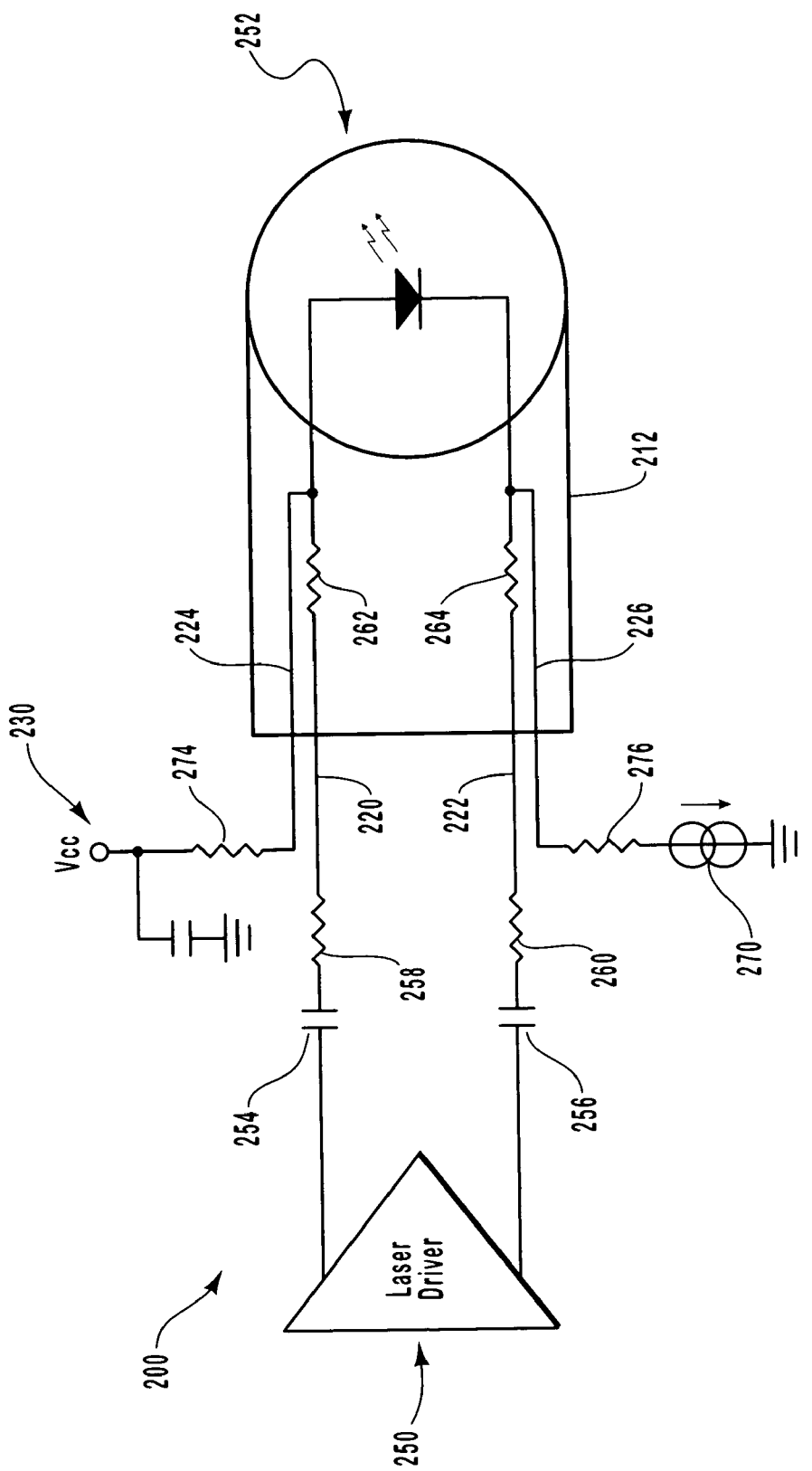
FIG. 4 illustrates an exemplary circuit schematic of a portion of the transceiver configured in accordance with one aspect of the present invention depicted in FIG. 2.

Similarly, optical assembly 214 is one example of structures capable of performing the function of means for generating one or more optical signals. Various types of optical assemblies and means for generating one or more optical signals are known to those skilled in the art in light of the teaching contained herein. For example, and not by way of limitation, optical assembly, and means for generating one or more optical signals, can be a laser diode, as represented in FIG. 4. In another configuration, the means for generating one or more optical signals can be a light emitting diode (LED), a laser diode, or the like, with associated circuitry.

Figure 1:
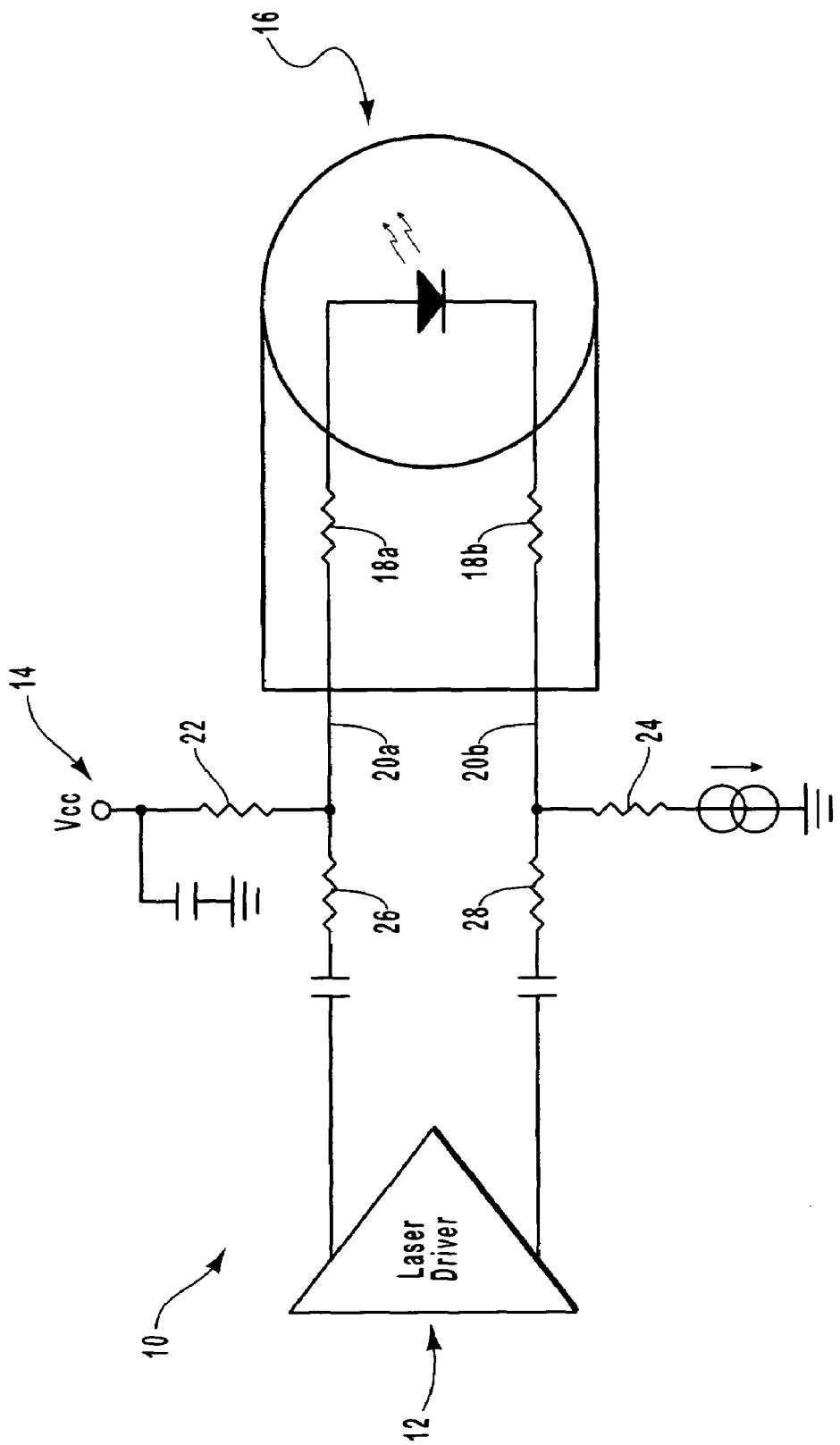
FIG. 1 illustrates a prior art embodiment of a flexible circuit adapted to connect a laser driver and a laser diode.

Referring still to FIG. 3, in addition to including transmission lines 220 and 222, flexible circuit 212 includes transmission lines 224 and 226 for delivering a bias current from a voltage source 230 to optical assembly 214. In prior art transceivers, such as illustrated in FIG. 1, the bias current was delivered along the same transmission line(s) as the AC modulated signal. Consequently, when matching impedances were need to reduce the effects of reflection, the bias current passed through both the resistance associated with the voltage source, the transmission lines connecting the voltage source to the flexible circuit, the flexible circuit, and the matching impedances, resulting in the need for internally increasing the externally supplied current to attain the desired biasing affect.

The flexible circuit 212 of the present invention, however, uses separate transmission lines 224 and 226 to deliver the bias current to optical assembly 214. These separate transmission lines 224 and 226, as schematically shown, connected to transmission lines 220 and 222 at the distal end of flexible circuit 212, i.e., at a distal end of each transmission lines 220 and 222. This connecting point can be, in an electrical sense and/or physical sense, as close to optical assembly 214 as is possible. Furthermore, when transmission lines 220 and 222 include matching impedances, transmission lines 224 and 226 connect to transmission lines 220 and 222, respectively, at a point distal to matching impedances or at a point between the matching impedances and optical assembly 214.

Due to the above configuration, the AC modulation signal is efficiently delivered to optical assembly 214 because the bias circuit appears as a large load in parallel with a small resistance associated with optical assembly 214. Further, since the matching impedances are not in series with the bias circuit, the bias supply voltage needed is reduced. Additionally, this configuration allows a controlled impedance line for the bias current which can be properly terminated at printed circuit board 104 (FIG. 2), thereby avoiding reflections when high speed signals are delivered to optical assembly 214.

Referring now to FIG. 4, illustrated is another schematic representation of a portion of transceiver module 100, the same portion as schematically illustrated in FIG. 3. FIG. 4 depicts an exemplary circuit configuration and components; however, this is in no way limiting to the various other configurations and components that can be used to perform the desired functions described herein. Like components of those described in FIG. 3 are referenced by like numerals in FIG. 4.

As shown, a laser driver 250 communicates with a laser diode 252 by way of two transmission lines 220 and 222 incorporated within flexible circuit 212. The laser driver 250 is part of driver circuit 212 of FIG. 3 and is capacitively coupled to laser diode 252 by way of capacitors 254 and 256 that prevent the flow of DC signals to laser diode 252 from laser driver 250. Each capacitor 254 and 256 is in series with a resistor/impedance 258 and 260, respectively, which is used to match to the effective impedance of the transmission line 220 and 222. For instance, resistors/impedances 258 and 260 can be smaller than what would be required in prior art configurations, such as but not limited to that illustrated in FIG. 1. For instance, impedances 258 and 260 may range from about 2 Ohms to about 15 Ohms.

Generally, laser driver 250 functions to generate AC modulated signals the cause laser diode 252 to produce optical or light signals for delivery along an optical fiber (not shown). The AC modulated signals flow along transmission lines 220 and 222 and through matching impedances 262 and 264, which have values equal to either the internal impedance of laser driver 250 or associated surge impedance associated with transmission lines 220 and 222, respectively. By so doing, matching impedances 262 and 264 assist in maximizing the signal strength of the AC modulated signals delivered to laser diode 252 from laser driver 250, while minimizing reflection and distortion of the AC modulated signals. Matching impedances 262 and 264 may range from about 12 Ohms to about 20 Ohms Connected to transmission lines 220 and 222 at a point between matching impedances 262 and 264 and laser diode 230 are transmission lines 224 and 226. These transmission lines 224 and 226 form part of the bias circuit associated with voltage source 230, such as a DC voltage source. Through connecting the bias circuit to transmission lines 224 and 226 at a point distal to matching impedances 262 and 264, transceiver module 200 no longer has the bias current in series with matching impedances 262 and 264. This reduces the total voltage needed for the bias voltage control, thereby eliminating the need to increase the supply voltage delivered to transceiver module 200.

As shown, transmission lines 224 and 226 connect to voltage source (Vcc) 230 and current source 270, respectively. Current source 270 regulates the current provided by Vcc 230. Therefore, it can be understood that placement of current source 270 in connection with transmission line 226 is only one possible location. For example, current source 270 can alternatively be connected to transmission line 224, with voltage source 230 being connected to transmission line 226.

Each transmission line 222 and 224 has an associated resistance, depicted by resistors 274 and 276. The values of resistors 274 and 276 can vary depending upon the particular resistance desired for each transmission line 222 and 224. For instance, resistors 274 and 276 can be smaller than what would be required in prior art configurations, such as but not limited to that illustrated in FIG. 1. For instance, resistors 274 and 276 may range from about 20 Ohms to about 25 Ohms.

To more fully illustrate the features and functions of the present invention, example values for one or more of the above-referenced transmission lines, resistors, and impedances are provided to illustrate the manner by which the present invention delivers modulated signals to an optical assembly of a transceiver, while reducing the voltage needed to operate the transceiver. Although specific values are provided herein, these are considered as illustrative only, with one skilled in the art being able to identify other applicable values that would allow a transceiver module to perform the desired functions discussed herein.

With reference to the prior art configuration illustrated in FIG. 1, each of the referenced transmission lines, resistors, and impedances can have specific values as listed in Table 1.

TABLE 1

| Component | Value |
| --- | --- |
| Source Matching Impedance (26) | 13 Ω |
| Source Matching Impedance (28) | 13 Ω |
| Matching Impedance (18a) | 20 Ω |
| Matching Impedance (18b) | 20 Ω |
| Bias resistors (22) | 50 Ω |
| Bias resistors (24) | 50 Ω |
| Supply Voltage (14) | >8.5 V |
| Laser Diode Impedance (Not Shown) | 5 Ω |

As can be understood, bias resistors 22 and 24 are 50 Ω, while the supply voltage 14 needs to be greater than 8.5 V to accommodate for voltage losses in the circuitry. Embodiments of the present invention reduce the DC voltage needed, while maintaining the functionality of the transceiver. With respect to FIG. 4, each referenced transmission line, resistance, and impedance can have the specific values listed in Table 2.

TABLE 2

| Component | Value |
|---|---|
| Source Matching Impedance (258) | 13 Ω |
| Source Matching Impedance (260) | 13 Ω |
| Matching Impedance (262) | 20 Ω |
| Matching Impedance (264) | 20 Ω |
| Bias Transmission Line Terminations (274) | 25 Ω |
| Bias Transmission Line Terminations (276) | 25 Ω |
| Supply Voltage (230) | 5 V |
| Laser Diode Impedance (Not Shown) | 5 Ω |

As can be understood from a comparison between Table 1 and Table 2, the transmission line impedances of the circuitry in accordance with the teaching of the present invention are smaller than the transmission line impedances of the prior art circuitry illustrated in FIG. 4. Further, the supply voltage is less than the supply voltage associated with the prior art circuitry. With the circuit configuration as illustrated in FIG. 4 and the above-referenced values, the transceiver module is capable of efficiently delivering AC modulated signals to the laser diode without the need to internally increase the supply voltage to accommodate for losses from the impedances and resistances. The AC modulated signals are efficiently delivered to the laser diode because the DC bias circuit appears as a ~25 Ω load in parallel with the ~2.5 Ω half resistance of the laser diode. Using this small impedance, i.e., the ~25 Ω load, no increase in the supply voltage is needed to deliver the AC modulated signals to the laser diode.

Generally, the resistances/impedances of the circuitry depicted in FIG. 4 can be similar to those that would be required in a prior art device, such as is illustrate in FIG. 1, with the exception that the transmission line resistors in the bias circuit can be smaller. This also results in a smaller DC bias voltage than would be used in the prior art circuitry of FIG. 1.

Consequently, the embodiments of the present invention are capable of delivering modulated signals to an optical assembly, such as a laser diode, of a transceiver, while reducing the voltage used in portions of the circuitry of the transceiver and minimizing the effects of reflection and distortion of the AC modulated signals. In this manner, the embodiment of the present invention provide a mechanism by which the size of transceiver modules can be minimized, while maintaining the capabilities of generating high speed AC modulated signals and associated high speed optical or light signals.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A circuit adapted to connect a driver circuit and an optical assembly, said circuit comprising:
   a first transmission line adapted to deliver a first signal from the driver circuit to the optical assembly, said first transmission line comprising a first end adapted to connect to the driver circuit and a second end adapted to connect to the optical assembly;
   a second transmission line used to bias said first signal, said second transmission line being electrically connected to said second end of said first transmission line; and
   a flexible member that includes the first and second transmission lines,
   wherein said first transmission line comprises a matching impedance, and
   wherein said second transmission line is electrically connected to said first transmission line at a connection point that is located between said matching impedance and said optical assembly such that no matching impedance is positioned between said optical assembly and said connection point.

2. A circuit as recited in claim 1, wherein said optical assembly comprises a laser diode.

3. A circuit as recited in claim 1, wherein an end of said second transmission line is electrically connected to a direct current source.

4. A circuit as recited in claim 1, wherein said first signal is an alternating current signal.

5. A transceiver for use in transceiving signals, the transceiver comprising:
   a first transmission line comprising a first end, a first end matching impedance, a second end, and a second end matching impedance, said first transmission line electrically connected at said first end to a means for generating modulated signals and electrically connected at said second end to a means for generating optical signals based upon said modulated signals;
   a flexible member including first and second insulating layers between which a portion of the first transmission line is positioned; and
   means for biasing said modulated signals electrically connected to said second end of said first transmission line at a connection point that is located between said second end matching impedance and said means for generating optical signals.

6. A transceiver as recited in claim 5, wherein said means for generating modulated signals comprises a laser driver.

7. A transceiver as recited in claim 5, wherein said means for generating optical signals comprises a laser diode.

8. A transceiver as recited in claim 5, further comprising a flexible circuit incorporating said first transmission line and said second transmission line and electrically connecting said means for generating modulated signals to said means for generating optical signals based upon said modulated signals.

9. A transceiver as recited in claim 5, further comprising a current source, said current source configured to deliver a bias current to said means for generating optical signals.

10. A flexible circuit as recited in claim 5, wherein an end of said second transmission line is electrically connected to a direct current source.

11. A transceiver as recited in claim 5,
    wherein said first end matching impedance is configured to match an impedance of the means for generating modulated signals,
    wherein said second end matching impedance is configured to match an impedance of the means for generating optical signals, and
    wherein the second end matching impedance has a greater impedance value than the first end matching impedance.

12. A transceiver, comprising:
    a driver circuit adapted to generate a modulated driver signal deliverable to an optical assembly;
    a current source in communication with said optical assembly and adapted to provide a bias current for said optical assembly; and a circuit electrically connecting at least two of said driver circuit, said direct current source, and said optical assembly, said circuit comprises:
  a first transmission line electrically connected to said driver circuit at a first end and to said optical assembly at a second end, said first transmission line being adapted to allow said modulated signal to be delivered to said optical assembly;
  a second transmission line electrically connected to said current source and to said optical assembly, said second transmission line being connected to said second end of said first transmission line; and
  first and second flexible insulating layers between which portions of the first and second transmission lines are disposed
wherein said first transmission line comprises at least one matching impedance, and
wherein said second transmission line is connected to said first transmission line at a connection point that is located between said at least one matching impedance and said optical assembly such that no matching impedance is positioned between said optical assembly and said connection point.

* * * * *